(12) United States Patent
Chiang et al.

(10) Patent No.: US 9,754,868 B2
(45) Date of Patent: Sep. 5, 2017

(54) SUBSTRATE STRUCTURE, ELECTRONIC PACKAGE AND METHOD FOR FABRICATING THE ELECTRONIC PACKAGE

(71) Applicant: Siliconware Precision Industries Co., Ltd., Taichung (TW)

(72) Inventors: Ching-Wen Chiang, Taichung (TW); Hsin-Chih Wang, Taichung (TW); Chih-Yuan Shih, Taichung (TW); Shih-Ching Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/069,387

(22) Filed: Mar. 14, 2016

(65) Prior Publication Data

US 2017/0194238 A1 Jul. 6, 2017

(30) Foreign Application Priority Data

Dec. 31, 2015 (TW) .............................. 104144636 A (51) Int. Cl.
| | |
|---|---|
| H01L 21/50 | (2006.01) |
| H01L 23/498 | (2006.01) |
| H01L 21/48 | (2006.01) |
| H01L 21/304 | (2006.01) |
| H01L 21/306 | (2006.01) |
| H01L 21/56 | (2006.01) |

(52) U.S. Cl.
CPC ...... *H01L 23/49827* (2013.01); *H01L 21/304* (2013.01); *H01L 21/306* (2013.01); *H01L 21/486* (2013.01); *H01L 21/563* (2013.01); *H01L 23/49811* (2013.01); *H01L 23/49833* (2013.01)

(58) Field of Classification Search
CPC .................................................. H01L 23/5226
See application file for complete search history.

(56) References Cited

U.S. PATENT DOCUMENTS

| 5,991,156 A * | 11/1999 | Bond ................. H01L 23/3128 174/16.3 |
| 6,324,069 B1 * | 11/2001 | Weber .................. H01L 21/563 174/260 |
| 6,602,740 B1 * | 8/2003 | Mitchell ................ H01L 21/56 257/E21.502 |
| 9,219,028 B1 * | 12/2015 | Higgins, III ........ H01L 23/5389 |
| 2005/0062165 A1 * | 3/2005 | Saenger ............ H01L 21/76807 257/774 |
| 2008/0290511 A1 * | 11/2008 | Van Veen ............ H01L 23/5389 257/737 |

(Continued)

*Primary Examiner* — Thao P Le
(74) *Attorney, Agent, or Firm* — Mintz Levin Cohn Ferris Glovsky and Popeo, P.C.; Peter F. Corless; Steven M. Jensen (57) ABSTRACT

A substrate structure is provided, which includes: a substrate body having a first surface and a second surface opposite to the first surface; and a plurality of conductive posts disposed on the first surface of the substrate body and electrically connected to the substrate body. By replacing conventional through silicon vias (TSVs) with the conductive posts, the present disclosure greatly reduces the fabrication cost. The present disclosure further provides an electronic package having the substrate structure and a method for fabricating the electronic package.

6 Claims, 6 Drawing Sheets

(56) References Cited

U.S. PATENT DOCUMENTS

| | | | |
|---|---|---|---|
| 2014/0319696 A1* | 10/2014 | Yu .......................... | H01L 24/96 257/774 |
| 2015/0111496 A1* | 4/2015 | McCormack ........ | H04B 5/0031 455/41.1 |
| 2015/0295305 A1* | 10/2015 | Herbsommer ....... | H01O 19/108 343/873 |

* cited by examiner

SUBSTRATE STRUCTURE, ELECTRONIC PACKAGE AND METHOD FOR FABRICATING THE ELECTRONIC PACKAGE

CROSS-REFERENCE TO RELATED APPLICATION

The present application is based on, and claims priority from Taiwanese Application Number 104144636, filed Dec. 31, 2015, the disclosure of which is hereby incorporated by reference herein in its entirety.

BACKGROUND

1. Technical Field

The present disclosure relates to electronic packages, and, more particularly, to a substrate structure, an electronic package and a method for fabricating the electronic package.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIGS. 1A to 1F are schematic cross-sectional views showing a method for fabricating a 3D chip stacking-type electronic package 1 according to the prior art.

Figure 1A:
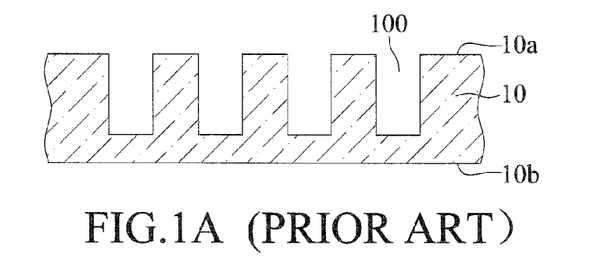
FIGS. 1A to 1F are schematic cross-sectional views showing a method for fabricating an electronic package according to prior art, wherein FIG. 1C' is a partially enlarged view of FIG. 1C.

Referring to FIG. 1A, a silicon substrate 10 having a chip mounting side 10a and an opposite external connection side 10b is provided, and a plurality of vias 100 are formed on the chip mounting side 10a of the silicon substrate 10.

Figure 1B:
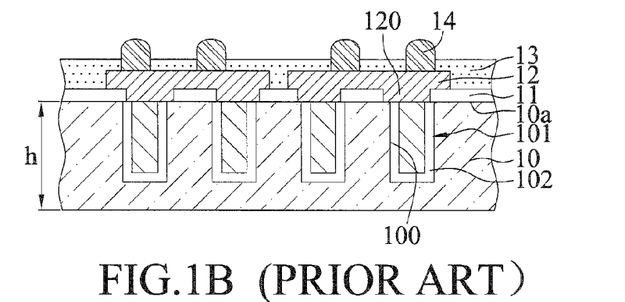

Referring to FIG. 1B, an insulating material 102 and a conductive material such as copper are filled in the vias 100 to form a plurality of through silicon vias (TSVs) 101. Then, a redistribution layer (RDL) structure is formed on the chip mounting side 10a of the silicon substrate 10 and electrically connected to the TSVs 101.

In the formation of the RDL structure, a dielectric layer 11 is first formed on the chip mounting side 10a of the silicon substrate 10; then a circuit layer 12 is formed on the dielectric layer 11, wherein the circuit layer 12 has a plurality of conductive vias 120 formed in the dielectric layer 11 and electrically connected to the TSVs 101; then an insulating layer 13 is formed on the dielectric layer 11 and the circuit layer 12, with a portion of the circuit layer 12 exposed; and then a plurality of first conductive elements 14 such as solder bumps are bonded to the exposed portions of the circuit layer 12.

Figure 1C:
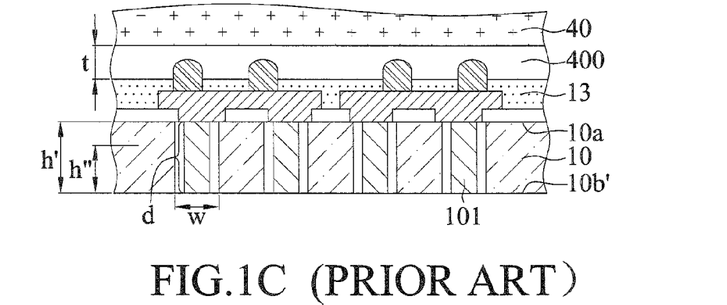

Referring to FIG. 1C, a temporary carrier 40 made of, for example, glass is bonded to the insulating layer 13 on the chip mounting side 10a through an adhesive 400, and then a portion of the silicon substrate 10 at the external connection side 10b is removed by grinding, so as to form an external connection side 10b' exposing one end surfaces of the TSVs 101.

The silicon substrate 10 has a thickness h of about 700 to 750 μm before the grinding process (shown in FIG. 1B) is performed and a thickness h' of 100 μm after the grinding process (shown in FIG. 1C) is performed. Generally, the silicon substrate 10 is ground by a mechanical grinding process to a thickness of 102 to 105 μm first, and then ground by a chemical-mechanical polishing (CMP) process to 100 μm.

The thickness t of the adhesive 400 is 50 μm, and is limited by a total thickness variation (TTV) of the adhesive 400. For example, referring to FIG. 1C', if the TTV of the adhesive 400 is too large (for example, about 10 μm), the silicon substrate 10 will be tilted with one side higher than the other. As such, the silicon substrate 10 is likely cracked during the grinding process. In addition, after the grinding process is performed, only a portion of the TSVs 101 is exposed, with the other TSVs 101 unexposed.

Furthermore, limited by the thickness h' of 100 μm of the silicon substrate 10 after the grinding process is performed, the TSVs 101 have a certain depth d of about 100 μm. Therefore, the depth to width ratio of the TSVs 101 is limited to 100 μm/10 μm (i.e., the TSVs 101 have a depth of 100 μm and a width w of 10 μm).

In addition, the TSVs 101 having a depth of 10 μm cannot be mass produced due to a high fabrication cost. Since the TTV of the adhesive 400 reaches about 10 μm, the silicon substrate 10 can only be ground by the grinding process (including the mechanical grinding and CMP processes) to the thickness h' of 100 μm and then a wet etching process is required to remove the silicon substrate 10 by a thickness h" of about 90 μm so as to expose the TSVs 101. However, the wet etching process is time-consuming and needs a large amount of etching solution, thus increasing the fabrication cost.

Figure 1D:
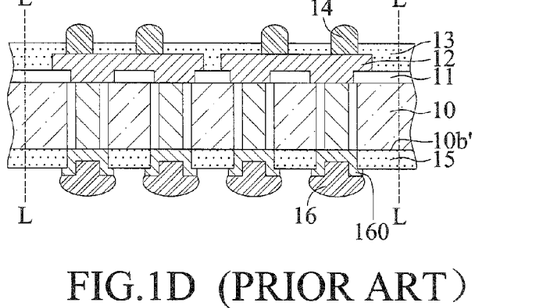

Referring to FIG. 1D, an insulating layer 15 is formed on the external connection side 10b' of the silicon substrate 10, with the end surfaces of the TSVs 101 exposed. Then, a plurality of second conductive elements 16 are formed on the end surfaces of the TSVs 101 and are electrically connected to the TSVs 101. The second conductive elements 16 can include a solder material or can be copper bumps. Further, an under bump metallurgy (UBM) layer 160 can be optionally formed below the second conductive elements 16.

Figure 1E:
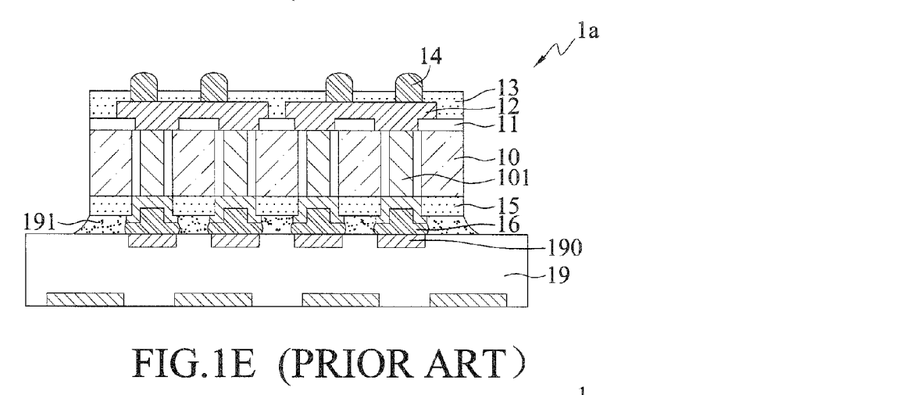

Referring to FIG. 1E, a singulation process is performed along cutting paths L of FIG. 1D to obtain a plurality of silicon interposers 1a. Then, such a silicon interposer 1a is disposed on a packaging substrate 19 through the second conductive elements 16. The packaging substrate 19 has a plurality of conductive pads 190 electrically connected to the TSVs 101 through the second conductive elements 16, and the conductive pads 190 have a large pitch therebetween. Subsequently, an underfill 191 is formed between the silicon interposer 1a and the packaging substrate 19 to encapsulate the second conductive elements 16.

Figure 1F:
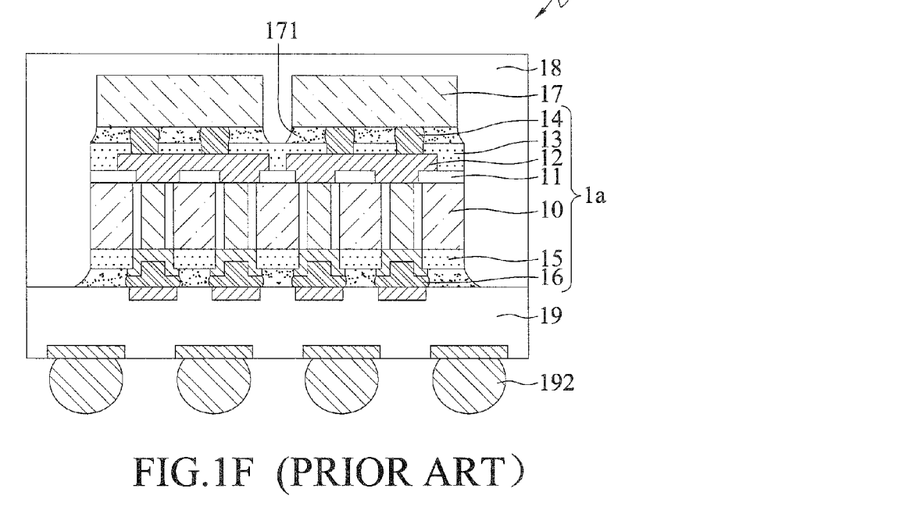

Referring to FIG. 1F, a plurality of electronic elements 17 such as semiconductor chips are disposed on the first conductive elements 14 so as to be electrically connected to the circuit layer 12. The electronic elements 17 are bonded to the first conductive elements 14 in a flip-chip manner, and an underfill 171 is formed between the electronic elements 17 and the silicon interposer 1a to encapsulate the first conductive elements 14. The electronic elements 17 have a plurality of electrode pads having a small pitch therebetween.

Then, an encapsulant 18 is formed on the packaging substrate 19 to encapsulate the electronic elements 17 and the silicon interposer 1a.

A plurality of solder balls 192 are formed on a lower side of the packaging substrate 19 for mounting an electronic device, for example, a circuit board (not shown). As such, an electronic package 1 is obtained.

In the electronic package 1, the silicon interposer 1a serves as a signal transmission medium between the electronic elements 17 and the packaging substrate 19. To achieve a suitable silicon interposer 1a, the TSVs 101 must be controlled to have a certain depth to width ratio (100 μm/10 μm), which, however, consumes a large amount of time and chemical agent and incurs a high fabrication cost.

Further, during the CMP process, copper ions of the TSVs 101 can diffuse into the silicon substrate 10 and cause a bridging or leakage problem between the TSVs 101.

Furthermore, since a short circuit likely occurs between the ball-shaped second conductive elements 16 having a small pitch therebetween, the density of the second conductive elements 16 is limited.

On the other hand, if the silicon interposer 1a is formed with conductive posts instead of the second conductive elements 16, the silicon interposer 1a needs to be disposed in an electroplating bath, which increases not only the process difficulty but also the risk of damage of the silicon interposer 1a. Therefore, it is difficult to achieve a high pin count for the silicon interposer 1a and hence the function or performance of end products is limited.

Therefore, how to overcome the above-described drawbacks has become critical.

SUMMARY

In view of the above-described drawbacks, the present disclosure provides a substrate structure, which comprises: a substrate body having a first surface and a second surface opposite to the first surface; and a plurality of conductive posts disposed on the first surface of the substrate body and electrically connected to the substrate body.

The present disclosure further provides an electronic package, which comprises: a substrate body having a first surface and a second surface opposite to the first surface; a plurality of conductive posts disposed on the first surface of the substrate body and electrically connected to the substrate body; at least an electronic element disposed on the second surface of the substrate body and electrically connected to the substrate body; and an encapsulant formed on the second surface of the substrate body and encapsulating the electronic element.

The present disclosure further provides a method for fabricating an electronic package, which comprises: disposing a plurality of conductive posts in a carrier; forming on the carrier a substrate body electrically connected to the conductive posts; disposing on the substrate body at least an electronic element electrically connected to the substrate body; forming on the substrate body an encapsulant encapsulating the electronic element; and removing the carrier so as for the conductive posts to protrude from the substrate body.

In an embodiment, the carrier can be an insulating board, a metal board or a semiconductor substrate.

In an embodiment, removing the carrier can comprise: disposing a temporary carrier on the encapsulant; performing a grinding process to thin the carrier; and removing a remaining portion of the carrier by etching. After removing the carrier, the method can further comprise removing the temporary carrier. For example, the temporary carrier is a glass carrier having an adhesive formed thereon and having a thickness of 10 μm. In another embodiment, the temporary carrier can be a tape having a thickness of 10 μm.

In an embodiment, the conductive posts can have a length to width ratio in a range of from 1 to 5.

In an embodiment, an air gap can be formed between any two adjacent ones of the conductive posts.

In an embodiment, a plurality of conductive elements can be disposed on the conductive posts.

According to the present disclosure, the length to width ratio of the conductive posts is reduced to meet the miniaturization requirement of electronic products. As such, the product yield is increased, and the fabrication cost is reduced.

Further, by replacing the conventional through silicon vias (TSVs) with the conductive posts, the present disclosure greatly reduces the fabrication difficulty and cost.

DETAILED DESCRIPTION OF PREFERRED EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2H are schematic cross-sectional views showing a method for fabricating an electronic package 2 according to the present disclosure.

Figure 2A:
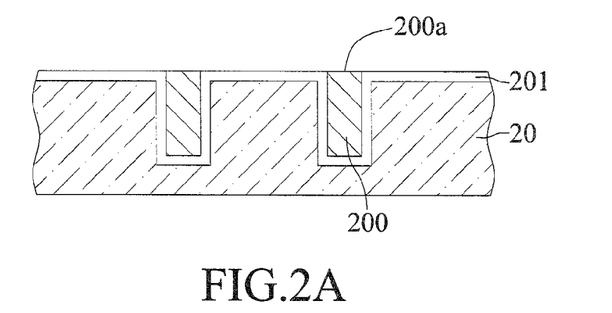
FIGS. 2A to 2H are schematic cross-sectional views showing a method for fabricating an electronic package according to the present disclosure, wherein FIG. 2G' shows another embodiment of FIG. 2G.

Referring to FIG. 2A, a carrier 20 is provided. The carrier 20 has a plurality of conductive posts 200 extending inwardly from a surface of the carrier 20.

In an embodiment, the carrier 20 is an insulating board, a metal board or a semiconductor substrate made of silicon or glass, and the conductive posts 200 are metal posts such as copper posts.

As an example, the process for forming the conductive posts 200 in the carrier 20 of a semiconductor substrate is detailed as follows. A plurality of vias are first formed on the surface of the carrier 20, and then an insulating layer 201 is formed on the surface of the carrier 20 and walls of the vias. Subsequently, a conductive material such as copper is filled in the vias to form the conductive posts 200. Thereafter, a planarization process is performed to cause upper end surfaces 200a of the conductive posts 200 to be flush with a surface of the insulating layer 201.

Figure 2B:
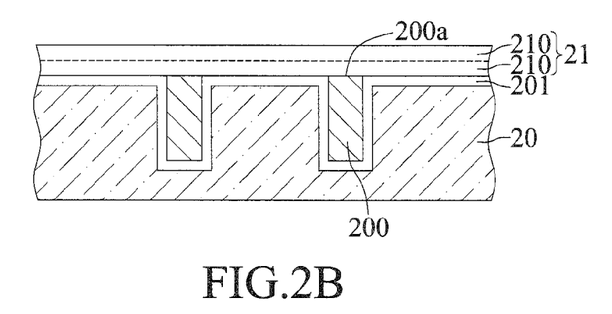

Referring to FIG. 2B, a first dielectric layer 21 is formed on the surface of the carrier 20.

In an embodiment, the first dielectric layer 21 is bonded to the upper end surfaces 200a of the conductive posts 200 and the surface of the insulating layer 201.

Further, the first dielectric layer 21 comprises two sublayers 210.

Figure 2C:
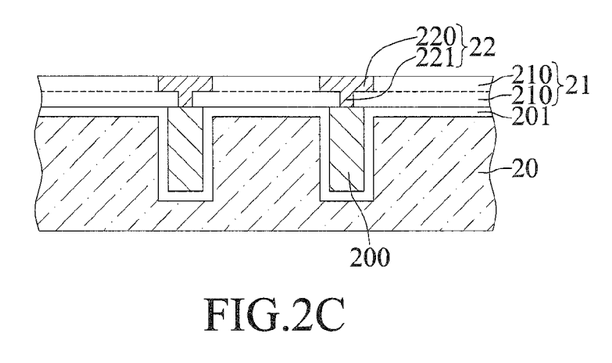

Referring to FIG. 2C, a first circuit layer 22 is formed in the first dielectric layer 21. The first circuit layer 22 has a plurality of first conductive pads 220 and a plurality of first conductive vias 221 electrically connecting the first conductive pads 220 and the conductive posts 200.

In an embodiment, the first conductive pads 220 are disposed in the upper sub-layer 210, and the first conductive vias 221 are formed in the lower sub-layer 210.

A single one of the first conductive pads 220 is connected to a corresponding one of the first conductive vias 221.

Figure 2D:
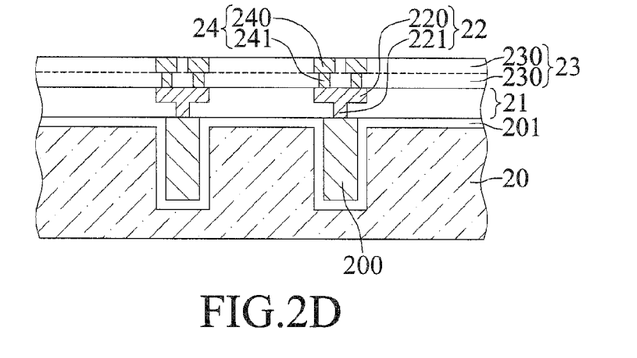

Referring to FIG. 2D, a second dielectric layer 23 is formed on the first dielectric layer, and a second circuit layer 24 is formed in the second dielectric layer 23. The second circuit layer 24 has a plurality of second conductive pads 240 and a plurality of second conductive vias 241 electrically connecting the second conductive pads 240 and the first circuit layer 22.

In an embodiment, the second dielectric layer 23 comprises two sub-layers 230, the second conductive pads 240 are formed in the upper sub-layer 230, and the second conductive vias 241 are formed in the lower sub-layer 230.

Further, a single one of the second conductive pads 240 is connected to a corresponding one of the second conductive vias 241, and a single one of the first conductive pads 220 is connected to two corresponding ones of the second conductive vias 241.

Figure 2E:
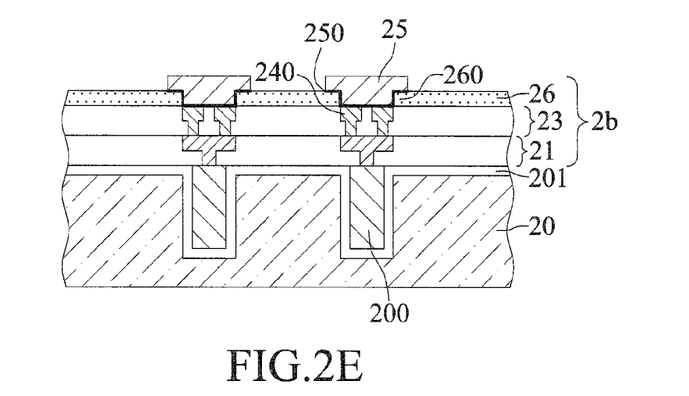

Referring to FIG. 2E, a plurality of first conductive elements 25 are disposed on the second conductive pads 240.

In an embodiment, an insulating layer 26 is first formed on the second dielectric layer 23, with the second conductive pads 240 exposed, and then the first conductive elements 25 are disposed on the second conductive pads 240.

Further, the first conductive elements 25 include a solder material or are copper bumps, and a UBM layer 250 is optionally formed below the first conductive elements 25.

In an embodiment, a single one of the first conductive elements 25 is connected to two corresponding ones of the second conductive pads 240. For example, a plurality of openings 260 are formed in the insulating layer 26, and a single one of the openings 260 exposes two corresponding ones of the second conductive pads 240. Then, the first conductive elements 25 are disposed in the openings 260 of the insulating layer 26.

The first dielectric layer 21, the first circuit layer 22, the second dielectric layer 23, the second circuit layer 24 and the first conductive elements 25 constitute a substrate body 2b, and the insulating layer 26 is optionally regarded as a portion of the substrate body 2b.

Figure 2F:
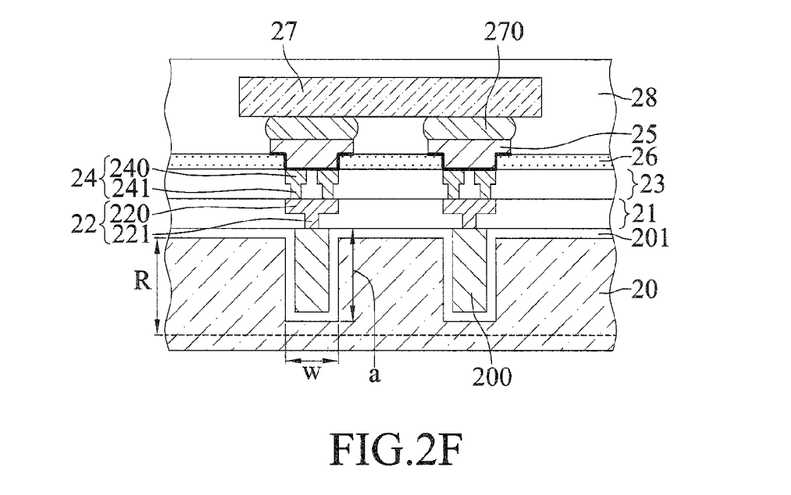

Referring to FIG. 2F, at least an electronic element 27 is disposed on the first conductive elements 25 so as to be electrically connected to the second circuit layer 24. Then, an encapsulant 28 is formed on the insulating layer 26 to encapsulate the electronic element 27.

In an embodiment, the electronic element 27 is an active element such as a semiconductor chip, a passive element such as a resistor, a capacitor or an inductor, or a combination thereof.

The electronic element 27 is bonded to the first conductive elements 25 through a plurality of conductive bumps 270, and a single one of the conductive bumps 270 is connected to a corresponding one of the first conductive elements 25.

The encapsulant 28 is made of a molding compound such as an epoxy resin, or a dielectric material.

Figure 2G:
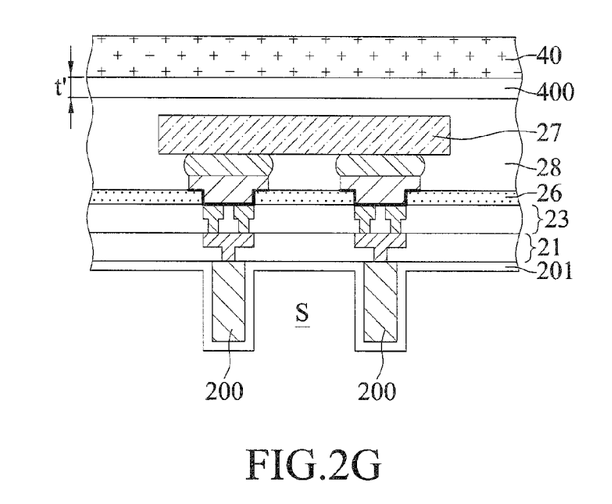

Referring to FIG. 2G, the carrier 20 is removed. As such, the insulating layer 201 is exposed, and the conductive posts 200 protrude from the first dielectric layer 21 and have an air gap S formed between any two adjacent ones of the conductive posts 200.

In an embodiment, referring to FIGS. 2G and 2G', a temporary carrier 40, 40' is disposed on the encapsulant 28 first, and then a grinding process (mechanical grinding in combination with CMP) is performed to thin the carrier 20 to a thickness R of about 25 μm. Subsequently, a wet etching process is performed to remove the remaining portion of the carrier 20.

Referring to FIG. 2G, the temporary carrier 40 is a glass carrier having an adhesive 400. Alternatively, referring to FIG. 2G', the temporary carrier 40' is a backside grinding tape. The thickness t' of the adhesive 400 or the thickness t" of the tape is about 10 um, and the TTV thereof is about 1 μm.

The carrier 20 can be ground to have a thickness R below 25 μm. As such, referring to FIG. 2F, the depth a of the conductive posts 200 can be 10 μm, and the depth to width ratio of the conductive posts 200 can be 2, i.e., 10 μm/5 μm (that is, the depth a of the conductive posts 200 is 10 μm and the width w of the conductive posts 200 is 5 μm).

Therefore, by coating a thin adhesive, the present disclosure improves the TTV of the adhesive so as to prevent cracking of the carrier 20 during a grinding process. Further, since the TTV is very small (about 1 μm), the carrier 20 can be thinned to a thickness R below 25 μm. Therefore, the subsequent wet etching process only needs to remove the carrier 20 having a thickness below 25 μm, thus greatly shortening the etching time and reducing the cost of etching solution.

Further, the conductive posts 200 can have a length to width ratio (i.e., depth to width ratio) ranging from 1 to 5 according to the practical need.

Furthermore, the post shape and the air gap S of the conductive posts 200 allow the conductive posts 200 to have a high density, and prevent a short circuit from occurring between the conductive posts 200, thereby improving the function or performance of end products.

Figure 2H:
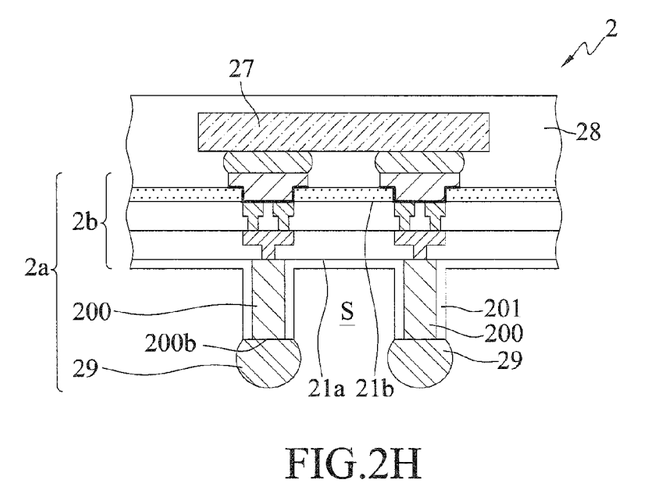

Referring to FIG. 2H, the insulating layer 201 on lower ends of the conductive posts 200 is removed to expose lower end surfaces 200b of the conductive posts 200. Then, a plurality of second conductive elements 29 such as solder balls are disposed on the lower end surfaces 200b of the conductive posts 200, and the temporary carrier 40 is removed, thus forming the electronic package 2 according to the present disclosure.

In an embodiment, the substrate body 2b, the conductive posts 200 and the second conductive elements 29 constitute a substrate structure 2a.

By completely removing the carrier 20 to expose the conductive posts 200 having an air gap S between any two adjacent ones of the conductive posts 200, the present disclosure avoids diffusion of copper ions of the conductive posts 200 into a silicon substrate as in the prior art, and thus no bridging or leakage problem occurs between the conductive posts 200.

Figure 3:
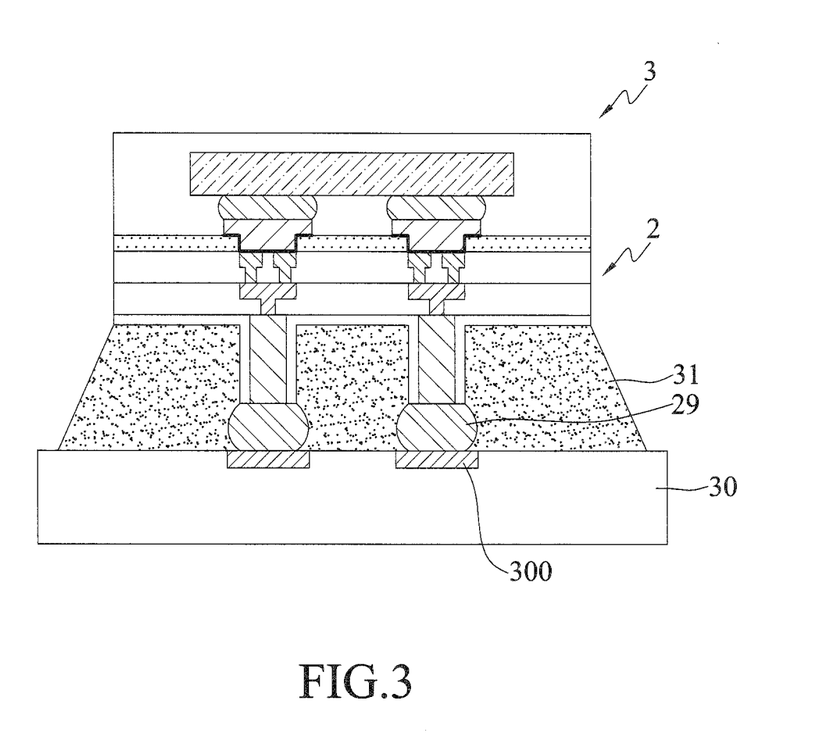
FIG. 3 is a schematic cross-sectional view showing a process performed after the process of FIG. 2H.

In a subsequent process, referring to FIG. 3, the electronic package 2 is disposed on a packaging substrate 30 through the second conductive elements 29. In an embodiment, the second conductive elements 29 are electrically connected to conductive pads 300 of the packaging substrate 30, and an underfill 31 is formed between the electronic package 2 and the packaging substrate 30, thus forming an electronic device 3.

According to the present disclosure, the conductive posts 200 can be fabricated with a small depth to width ratio (for example, 10 μm/5 μm) so as to meet the miniaturization requirement of end products.

Further, the small depth a of the conductive posts 200 facilitates to shorten the time required for etching the vias of FIG. 2A so as to increase the product yield and reduce the cost of chemical agent.

Furthermore, since the depth to width ratio of the conductive posts 200 is small, the present disclosure reduces the time required to remove the carrier 20, and reduces the consumption of chemical agent during removal of the carrier 20, thus reducing the fabrication cost.

In addition, by replacing the conventional TSVs with the conductive posts 200, the present disclosure dispenses with the conventional process for forming the TSVs having a certain depth to width ratio, thus greatly reducing the fabrication difficulty and cost.

The present disclosure further provides a substrate structure 2a, which has: a substrate body 2b having a first surface 21a and a second surface 21b opposite to the first surface 21a; a plurality of conductive posts 200 disposed on the first surface 21a of the substrate body 2b; and a plurality of second conductive elements 29 formed on the conductive posts 200.

The substrate body 2b has a first dielectric layer 21, a first circuit layer 22, a second dielectric layer 23 and a second circuit layer 24.

The conductive posts 200 are disposed on the first surface 21a of the substrate body 2b and electrically connected to the first circuit layer 22. The conductive posts 200 have a length to width ratio ranging from 1 to 5.

The present disclosure further provides an electronic package 2, which has: a substrate structure 2a; an electronic element 27 disposed on the substrate structure 2a; and an encapsulant 28 encapsulating the electronic element 27.

In an embodiment, the electronic element 27 is disposed on the second surface 21b of the substrate body 2b and electrically connected to the second circuit layer 24 through a plurality of first conductive elements 25.

The encapsulant 28 is formed on the second surface 21b of the substrate body 2b to encapsulate the electronic element 27.

According to the present disclosure, the length to width ratio of the conductive posts is reduced to meet the miniaturization requirement of electronic products. As such, the product yield is increased, and the fabrication cost is reduced.

Further, by replacing the conventional TSVs with the conductive posts, the present disclosure greatly reduces the fabrication difficulty and cost.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a substrate body having a first surface and a second surface opposite to the first surface;
    a plurality of conductive posts disposed on and protruding from the first surface of the substrate body and electrically connected to the substrate body, wherein a side of each of the conductive posts has an insulating layer, and any two adjacent ones of the insulating layers of the conductive posts have an air gap formed therebetween;
    at least an electronic element disposed on the second surface of the substrate body and electrically connected to the substrate body; and
    an encapsulant formed on the second surface of the substrate body and encapsulating the electronic element.

2. The electronic package of claim 1, wherein each of the conductive posts has a length to width ratio in a range of from 1 to 5.

3. The electronic package of claim 1, further comprising a plurality of conductive elements formed on the conductive posts.

4. A substrate structure, comprising:
    a substrate body having a first surface and a second surface opposite to the first surface;
    a plurality of conductive posts disposed on and protruding from the first surface of the substrate body and electrically connected to the substrate body, wherein a side of each of the conductive posts has an insulating layer, and any two adjacent ones of the insulating layers of the conductive posts have an air gap formed therebetween.

5. The substrate structure of claim 4, wherein each of the conductive posts has a length to width ratio in a range of from 1 to 5.

6. The substrate structure of claim 4, further comprising a plurality of conductive elements disposed on the conductive posts.

* * * * *